(12) United States Patent
Fullerton et al.

(10) Patent No.: US 6,650,513 B2
(45) Date of Patent: Nov. 18, 2003

(54) MAGNETIC DEVICES WITH A FERROMAGNETIC LAYER HAVING PERPENDICULAR MAGNETIC ANISOTROPY AND AN ANTIFERROMAGNETIC LAYER FOR PERPENDICULARLY EXCHANGE BIASING THE FERROMAGNETIC LAYER

(75) Inventors: Eric Edward Fullerton, Morgan Hill, CA (US); Stefan Maat, San Jose, CA (US); Stuart Stephen Papworth Parkin, San Jose, CA (US); Kentaro Takano, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 09/772,468

(22) Filed: Jan. 29, 2001

(65) Prior Publication Data

US 2002/0101692 A1 Aug. 1, 2002

(51) Int. Cl.[7] .................................................. G11B 5/39

(52) U.S. Cl. ..................................................... 360/324.2
(58) Field of Search .......................... 360/324.2, 324.12, 360/324, 324.11

(56) References Cited

U.S. PATENT DOCUMENTS

| | | | | |
|---|---|---|---|---|
| 5,492,720 A | * | 2/1996 | Gill et al. ..................... | 427/131 |
| 6,023,395 A | * | 2/2000 | Dill et al. .................. | 360/324.2 |
| 6,358,635 B1 | * | 3/2002 | Min et al. ..................... | 428/336 |

* cited by examiner

*Primary Examiner*—George J. Letscher
(74) *Attorney, Agent, or Firm*—Thomas R. Berthold; Daniel E. Johnson

(57) ABSTRACT

The invention is a magnetic device that includes a ferromagnetic/antiferromagnetic (F/AF) structure wherein the ferromagnetic layer is perpendicularly exchange biased by the antiferromagnetic layer. The invention has application to perpendicular magnetic recording disks and magnetic tunnel junction devices used as read heads for disk drives and memory cells in magnetic memory arrays.

1 Claim, 17 Drawing Sheets

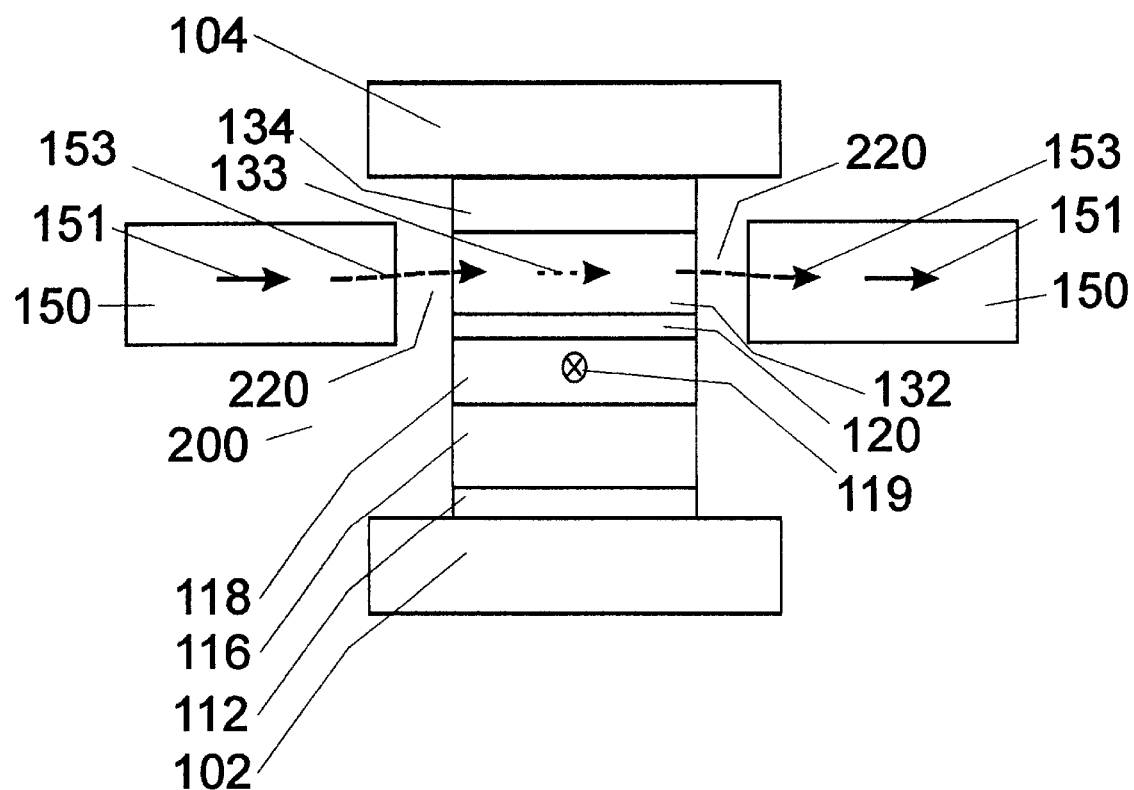
Figure 11 *(PRIOR ART)*

Figure 13 *(PRIOR ART)*

MAGNETIC DEVICES WITH A FERROMAGNETIC LAYER HAVING PERPENDICULAR MAGNETIC ANISOTROPY AND AN ANTIFERROMAGNETIC LAYER FOR PERPENDICULARLY EXCHANGE BIASING THE FERROMAGNETIC LAYER

BACKGROUND OF INVENTION

This invention relates in general to magnetic devices, such as magnetic recording disks and heads and magnetic tunnel junctions, and more particularly to magnetic devices that use exchange-coupled antiferromagnetic/ferromagnetic (AF/F) bilayers.

The exchange biasing of a ferromagnetic (F) film by an adjacent antiferromagnetic (AF) film is a phenomenon that has proven to have many useful technological applications in magnetic devices, and was first reported by W. H. Meiklejohn and C. P. Bean, Phys. Rev. 102, 1413 (1959). Whereas the magnetic hysteresis loop of a ferromagnetic single layer film is centered about zero field, a F/AF bilayer often will show an asymmetric magnetic hysteresis loop which is shifted from zero magnetic field in the plane of the film by an exchange-bias field, $H_B$. The direction of the exchange bias field within the plane of the film can be varied. In particular, this direction can be set during the growth of the AF film and is determined by the orientation of the magnetic moment of the F film when the AF film is deposited on top of the F film. The direction of the exchange bias field can also be changed by heating the F/AF bilayer after growth above the so-called blocking temperature, $T_B$, of the AF film. The blocking temperature is typically close to but below the Néel or magnetic ordering temperature of the AF film. In addition to an offset of the magnetic hysteresis loop of the F film, the F film in a F/AF bilayer typically shows an increased coercivity below $T_B$. The detailed mechanism which determines the magnitude of the exchange bias field and the increased coercive field is still a matter of considerable debate but it is generally agreed that these effects arise from an interfacial interaction between the F and AF films. See, for example the articles by J. Nogués and I. K. Schuller, J. Magn. Magn. Mat. 192, 203 (1999); and A.and K. Takano, J. Magn. Magn. Mat. 200, 552 (1999). Exchange-biased thin films have found several important applications, especially for magnetic recording read heads. In particular, exchange biasing can be used to locally harden or stiffen the magnetic response of, for example, the edges of a ferromagnetic sensing film in an anisotropic magnetoresistive read head. Exchange-biased ferromagnetic films can also be used to provide local magnetic fields such as those required for optimally biasing magnetoresistive read sensors. Exchange biasing is also an integral component of giant magnetoresistive spin-valve heads. More recently, exchange biasing has been used to engineer magnetic tunnel junction devices for use in magnetic recording read sensors applications and in magnetic random access memories, as described for example in IBM's U.S. Pat. No. 5,650,958.

Although exchange biasing has been widely studied and has found important technological applications, the phenomenon of exchange biasing has only previously been observed in F/AF thin film systems in which the moment of the ferromagnetic film lies in the plane of the film. For many applications, particularly for advanced magnetic recording media and advanced magnetic recording read heads, it would be extremely useful to be able to exchange bias ferromagnetic films whose moments lie perpendicular to the plane of the film.

What is needed is a means of providing perpendicular exchange bias for perpendicularly magnetized ferromagnetic films.

SUMMARY OF INVENTION

The invention is a magnetic device that includes a ferromagnetic/antiferromagnetic (F/AF) structure wherein the ferromagnetic layer has perpendicular magnetic anisotropy by being exchange coupled with the antiferromagnetic layer. When used in perpendicular magnetic recording disks, the F/AF structure can be a Co layer and a CoO AF layer located on top of the Co layer where the Co layer is the top layer in a series of Co/Pt bilayers, or a NiO AF layer and a Co layer located on top of the NiO layer, where the Co layer is the bottom layer in a series of Co/Pt bilayers. When used in a magnetic tunnel junction read head, the F/AF structure is the ferromagnetic free layer that is longitudinally biased at its edges by being perpendicularly exchange coupled to AF insulating oxide layers at these edges. When used in magnetic tunnel junction memory cells the F/AF structure is the fixed magnetic layer and a AF conducting layer where the AF layer exhibits perpendicular exchange biasing to the adjacent fixed ferromagnetic layer.

For a fuller understanding of the nature and advantages of the present invention, reference should be made to the following detailed description taken together with the accompanying figures.

BRIEF DESCRIPTION OF DRAWINGS

FIG. 11: A schematic sectional view of a prior art MTJ MR read head illustrating the arrangement of the various layers of material, including the structure for providing longitudinal biasing of the sensing ferromagnetic layer.

DETAILED DESCRIPTION

Numerous F/AF structures have been studied, where the AF layer is typically an alloy of Mn, for example, Mn—Fe, Mn—Ir, Mn—Pt, Mn—Pd, Mn—Pd—Pt, Cr—Mn, or Cr—Mn—Pt alloys, or NiO or CoO or and oxide of Ni and Co, and where the F layer is typically formed from either Co, Ni, or Fe or a binary or ternary alloy of these elements. However, exchange biasing has only previously been reported for F layers that are magnetized in the plane of the F layer. This limits the type of magnetic thin film structures that can be engineered to take advantage of exchange biasing to those in which the magnetic moment of the F layer lies within the plane of the thin film structure, i.e., those in which the F layer has an in-plane magnetic easy anisotropy axis.

In the present invention, the principle of perpendicular exchange biasing and coercivity enhancement has been demonstrated, i.e., exchange biasing for AF/F structures for which the F layer has an out-of-plane ferromagnetic easy axis and for a variety of well-known AF materials. The magnitude of the perpendicular exchange bias effect is comparable to that found in similar F/AF structures for which the F layer has an in-plane magnetic easy axis.

The use of perpendicular exchange bias, the subject of this invention, will be described with reference to two important applications, namely that of improved high density magnetic recording media and that of improved magnetic tunnel junction recording read heads Perpendicular Exchange Bias Materials Ferromagnetic Co films can show a magnetic anisotropy easy axis, which is either in-plane or perpendicular to the plane film, depending on their thickness. In particular, whereas Co films thicker than ~10 Å exhibit an in-plane easy axis, thinner Co films are known to show an out-of-plane easy axis. To obtain stronger out-of-plane magnetic anisotropy, thin Co films can be grown in a multilayered structure, where the thin Co layers are separated by a noble metal, such as Au or Pt. This is because the out-of-plane magnetic anisotropy, for such ultra-thin Co layers, is a result of an interfacial magnetic anisotropy which depends sensitively on the interface between the Co layer and the adjacent layers. The anisotropy of the bulk or volume of the Co film is typically in-plane although this can also have an out-of-plane component depending on the crystal structure and texture of the Co film. The same is true for Co—X alloys where X is, for example, Cr, Pt and Pd or a combination of these and other elements.

Figure 1A:
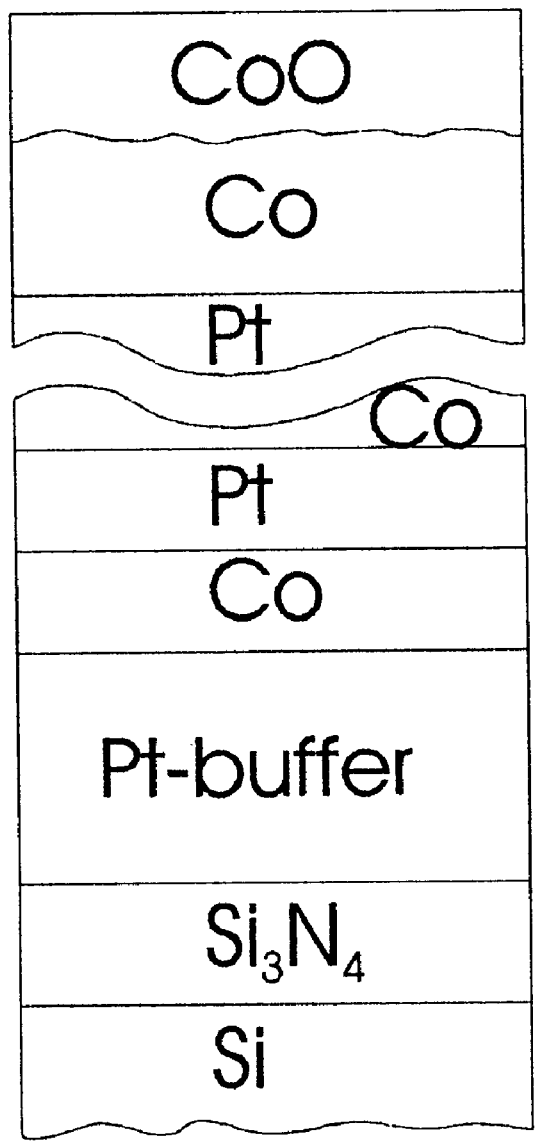
FIG. 1A: Co/Pt multilayer with perpendicular anisotropy exchange biased with a CoO layer.

FIG. 1A shows the structure of a sputtered multilayer of [CO/Pt]$_N$ where N is the number of Co/Pt repetitions, in which N was varied from 1 to 10. Co/Pt multilayers are candidates for perpendicular magnetic recording media and have also been used for perpendicular magneto-optic recording. The multilayer was deposited using dc magnetron sputtering in 3 mTorr argon at 150° C. on a Si (100) substrate covered with 20 Å Si$_3$N$_4$. A seed or buffer layer of 150 Å Pt was deposited first on the substrate prior to the multilayer deposition. On top of the Co/Pt multilayer was deposited a thin metallic Co layer, which was allowed to oxidize in the ambient atmosphere at room temperature to form CoO, which is an antiferromagnet. The magnetic properties of the films were measured in a SQUID magnetometer for temperatures in the range 10–300° K with the magnetic field aligned either in the plane or perpendicular to the plane of the Co layers.

Figure 2A:
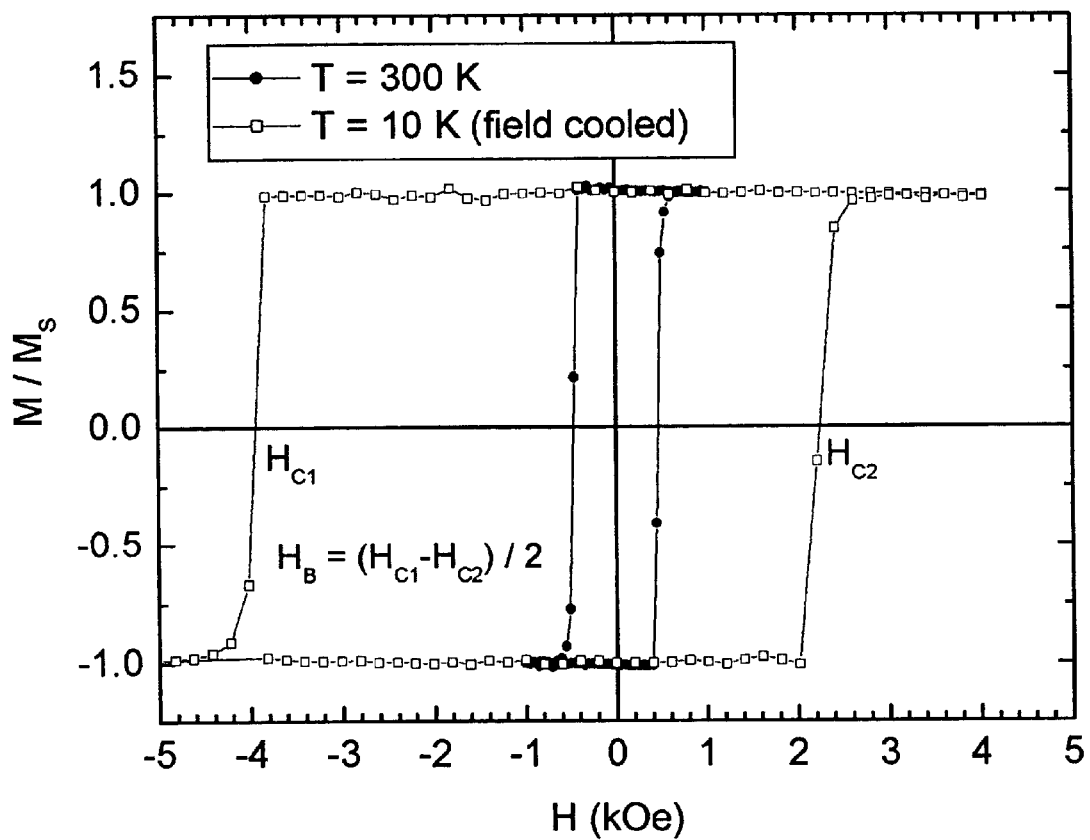
FIGS. 2A and 2B: Out of plane hysteresis loops of a [Co(4 Å)/Pt(5 Å)]$_5$ multilayer sample with (2A) and without (2B) a Co+CoO cap measured at 10° K and 300° K
Figure 2B:
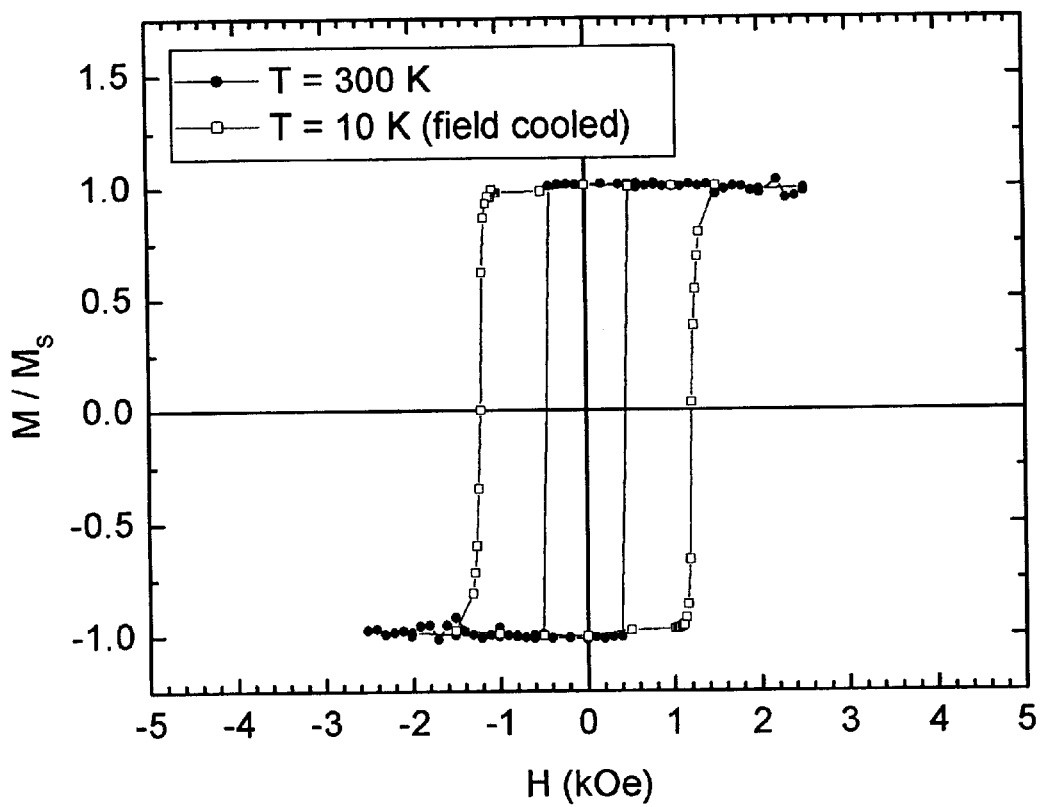

FIG. 2A shows the magnetization M normalized with respect to the saturation magnetization M-$_S$ of a [Co(4 Å)/Pt(5 Å)]$_5$ multilayered thin film sample with a Co/CoO capping layer versus out-of-plane magnetic field. The sample exhibits a square out-of-plane hysteresis loop with a coercive field H$_C$ ~460 Oe at 300° K. After cooling the sample to 10° K in a positive magnetic field of magnitude 4 kOe, the magnetization versus out-of-plane magnetic field hysteresis loop is observed to be shifted to a negative magnetic exchange bias field H$_B$=–0.9 kOe and has a significantly increased coercive field, H$_C$=3.1 kOe. The hysteresis loop of a similar sample without the Co/CoO cap layer showed no evidence of exchange bias after a similar field-cooling treatment, as shown in FIG. 2B. To determine the magnitude of the coercive field enhancement for the exchange-biased sample the temperature dependence of the coercive field of both [Co(4 Å)/Pt(5 Å)]$_5$ multilayered samples with and without Co/CoO cap layers were measured. At 10° K the coercive field of the sample without the Co/CoO cap layer was only ~1.2 kOe, about 2.5 times smaller than the sample with the Co/CoO cap layer. Thus the presence of the antiferromagnetic CoO layer is shown to give rise to both a perpendicular exchange bias field and an increased coercivity to the perpendicularly magnetized Co/Pt ferromagnetic multilayer.

The interfacial exchange-bias energy per unit area σ of the [Co(4 Å)/Pt(5 Å)]$_5$/Co/CoO sample at 10° K is calculated to be ~0.4 erg/cm$^2$ using the relation $$\sigma = M_S t H_B$$

where M$_S$ is the magnetic moment per unit volume, H$_B$ the exchange-bias field and t the thickness of the ferromagnetic layer. Here M$_S$ is taken to be that of bulk Co at 10° K (~1420 emu/cm$^3$) and t is the magnetic thickness of the [Co(4 Å)/Pt(5 Å)]$_5$/11 Å Co/4 Å CoO multilayer, i.e., ~31 Å. Note that the value of the exchange-bias energy is comparable to that observed for longitudinal biasing using thicker Co layers in Co/CoO bilayers, as described by T. Ambrose and C. L. Chien, Phys. Rev. Lett. 76, 1743 (1996).

Figure 3:
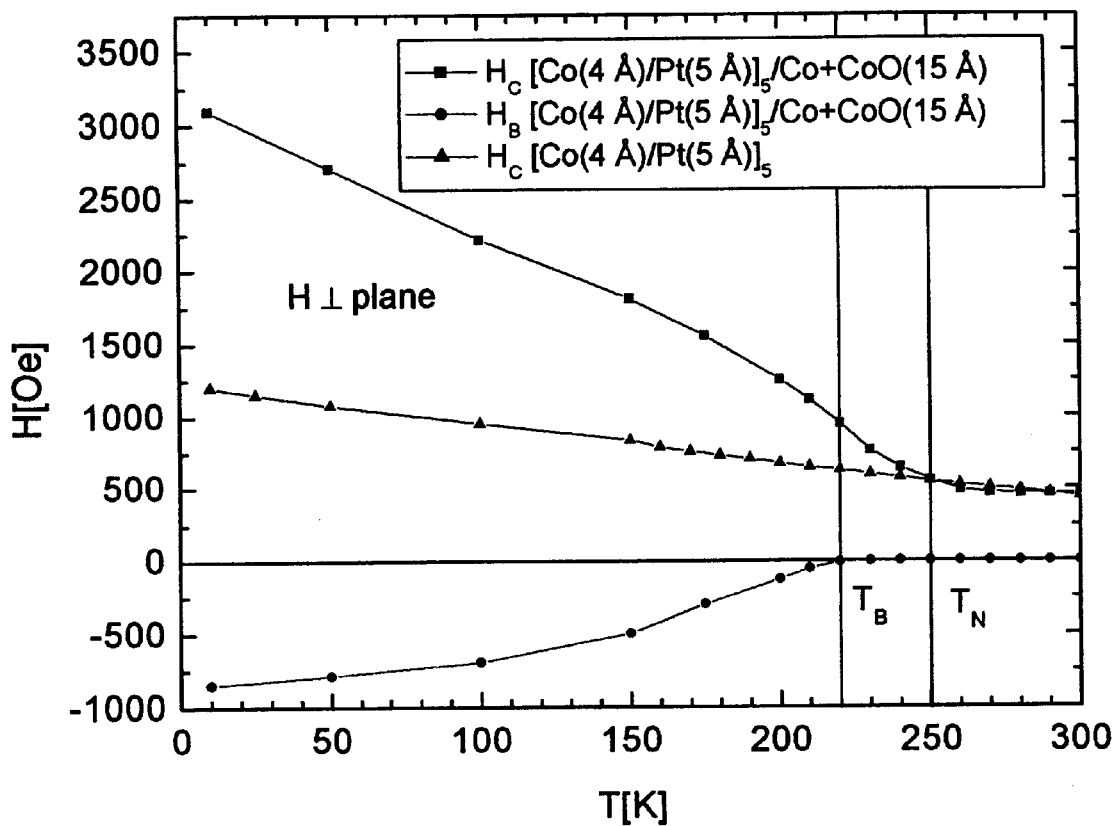
FIG. 3: Temperature dependence of the coercivity $H_C$ (squares) and loop shift $H_B$ (circles) of the out of plane hysteresis loops of the [Co(4 Å)/Pt(5 Å)]$_5$ multilayers with and without (triangles) Co+CoO (15 Å) cap.
Figure 4:
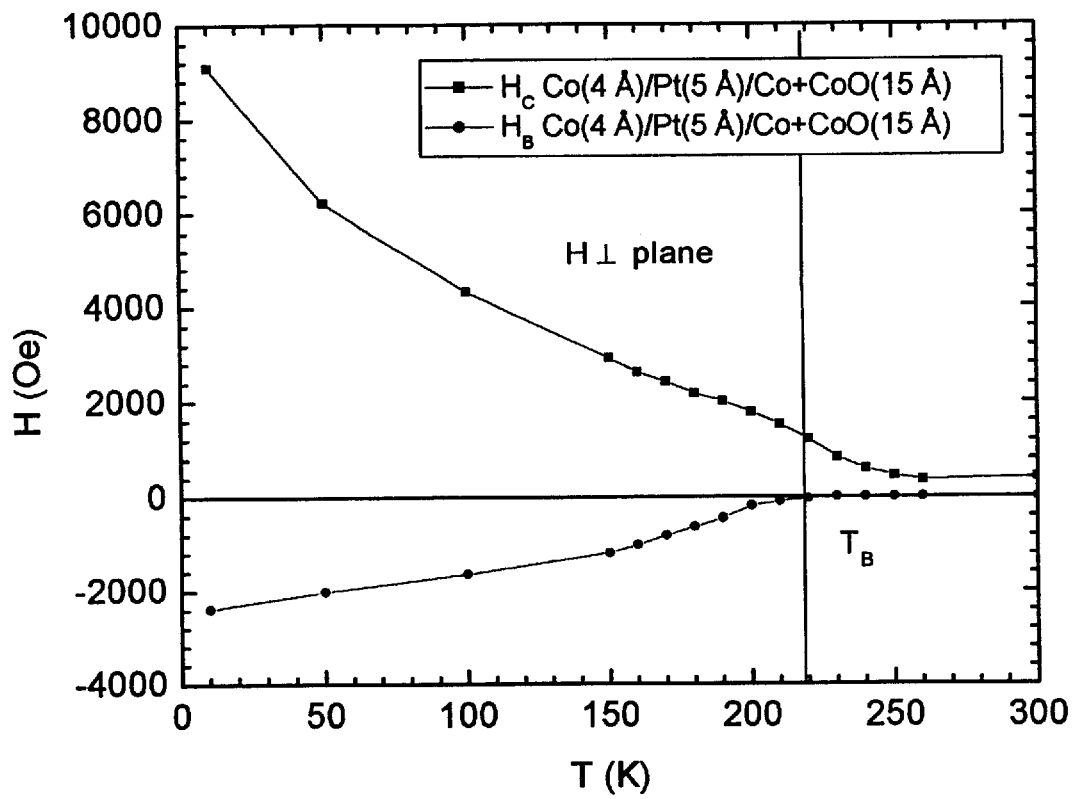
FIG. 4: Temperature dependence of the coercivity $H_C$ (squares) and loop shift $H_B$ (circles) of the out of plane hysteresis loops of a [Co(4 Å)/Pt(5 Å)] film with a Co+CoO (15 Å) cap.

The temperature dependence of H$_C$ and H$_B$ are shown in FIG. 3. The temperature at which H$_B$ vanishes is defined as the blocking temperature, T$_B$. From FIG. 3, a blocking temperature of ~220° K can be inferred, which is approximately 70° K. below the bulk Néel temperature of CoO (293° K). For the sample without the CoO layer, $H_C$ was found to depend linearly on temperature and coincides with the $H_C$ of the biased sample at ~250° K, which is the same as the Néel temperature of a thin CoO film. So, clearly the enhanced coercivity below 250° K arises from the interaction between the Co/Pt multilayer and the AF CoO layer. Due to the interfacial nature of the AF/F exchange coupling, the biasing effect should scale approximately with the inverse thickness of the ferromagnetic layer, which is well documented for longitudinal biasing for F layers above some critical thickness. If this dependence is assumed to also hold true for perpendicular exchange biasing, then the magnitude of $H_C$ and $H_B$ for perpendicular exchange biasing should be enhanced significantly if the CoO layer is coupled only to a single bilayer of Co(4 Å)/Pt(5 Å), instead of five bilayers. Indeed, this assumption was verified, as indicated by the temperature dependence of $H_C$ and $H_B$ shown in FIG. 4 (obtained after cooling the sample to 10° K in a field of 4 kOe). Note that at 10° K, for example, the magnitude of the exchange bias field is ~2.4 kOe and the coercive field is ~9 kOe, which are significantly higher than values of $H_B$ and $H_C$ found for the multilayer sample of FIG. 3.

Since the Néel temperature of CoO is approximately room temperature (~290° K), this is not a useful material for most applications, particularly for magnetic recording applications. However, the Néel temperature of the related antiferromagnetic oxide, NiO, is well above room temperature and just like CoO is well known to give rise to longitudinal exchange bias. Similarly, the family of oxides $Co_{1-x}Ni_xO$ are known to give rise to longitudinal exchange bias and have varying Néel temperatures intermediate between those of CoO and NiO, as described by M. J. Carey and A. E. Berkowitz, Appl. Phys. Lett. 60, 3060 (1992).

Figure 1B:
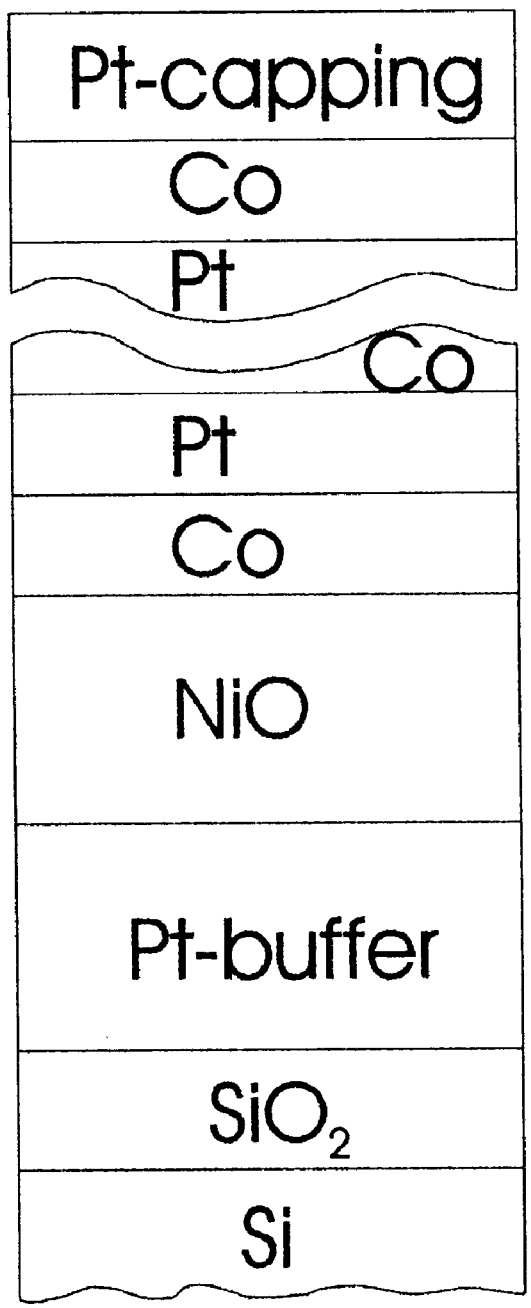
FIG. 1B: NiO antiferromagnetic layer exchange biased with Co/Pt multilayer with perpendicular anisotropy.
Figure 5:
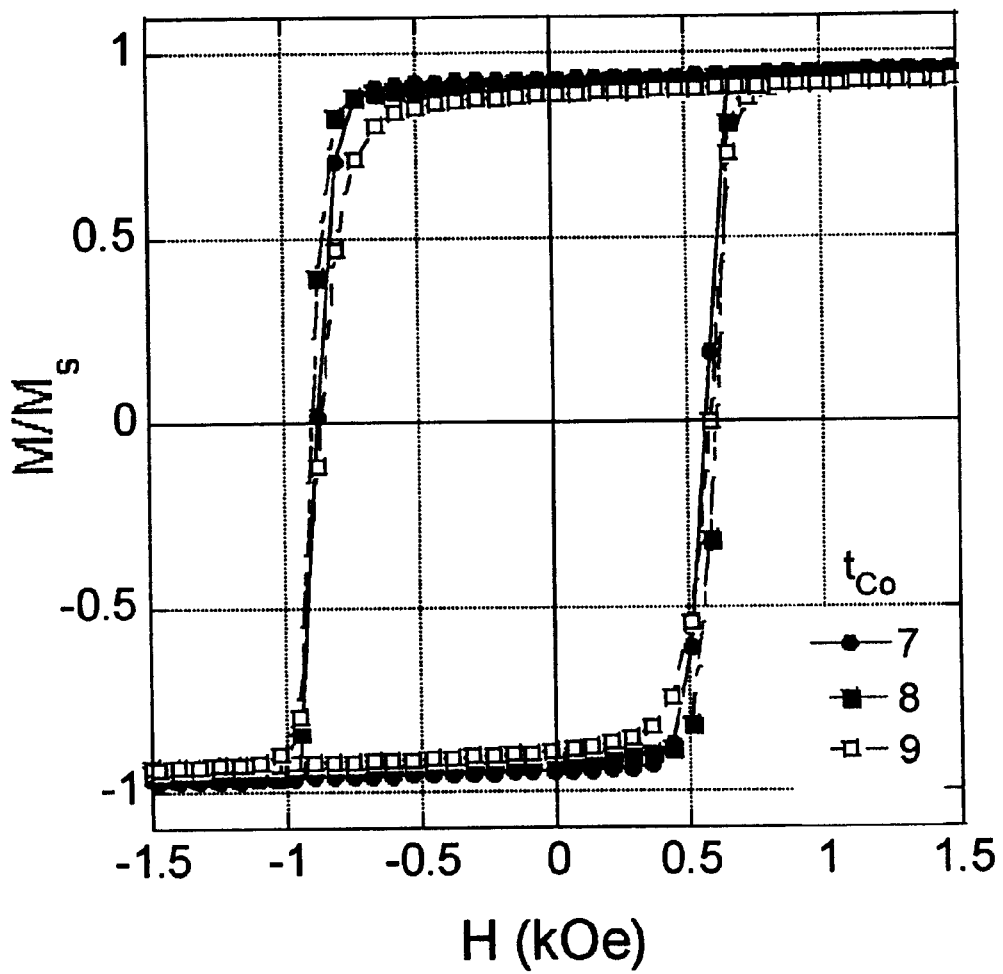
FIG. 5: Normalized magnetization perpendicular to the plane of the field versus perpendicular magnetic field for three Si/SiO$_2$/150 Å Pt/500 Å NiO/[x Å Co/7 Å Pt]$_N$ samples for Co thicknesses of ~7, 8 and 9 Å and N is 1.

FIG. 1B shows the structure of a perpendicular exchange biased system with NiO antiferromagnetic bias layers prepared by dc magnetron sputtering at ambient temperature (~40° C.) on Si(100) wafers covered with ~5000 Å thick $SiO_2$ layers (prepared by wet oxidation of the Si wafer). First a seed or buffer layer of 150 Å Pt was deposited, followed by a 500 Å thick NiO layer which was grown by reactive sputtering from a metallic Ni target in an Ar(65%)-$O_2$(35%) gas mixture. The composition of NiO was measured using the Rutherford backscattering (RBS) technique on a companion sample comprised solely of NiO deposited on a silicon wafer on which any silicon oxide was removed by a HF acid etch. On top of the NiO layer was grown a multilayer of $[CO/Pt]_N$ for which the thickness of the Co and Pt layers and the number of Co/Pt bilayer repeats were varied. The structure was capped with a thin 20 Å Pt layer to protect the Co/Pt multilayer from oxidation. FIG. 5 shows normalized magnetization versus perpendicular field loops measured at room temperature for three typical samples comprised of Si/$SiO_2$/150 Å Pt/500 Å NiO/[x Å Co/7 Å Pt]$_N$ for Co thicknesses of ~7, 8 and 9 Å and N is 1. The magnetic hysteresis loop shows a substantial perpendicular exchange bias field of ~200 The exchange bias field was set by heating the sample to 200° C. for 30 minutes and cooling the sample in a field of 1 kOe to room temperature. The as-deposited sample showed a much smaller exchange bias field of ~25 Oe. For this sample the NiO is polycrystalline but crystalline NiO films were prepared by reactive sputtering of NiO on Ag underlayers, which were prepared on hydrogen terminated silicon wafers. Using Si(111) and Si(100) wafers [111] and [100] oriented NiO films were prepared, respectively. Perpendicular exchange bias was found for both crystalline and polycrystalline NiO layers.

Figure 6:
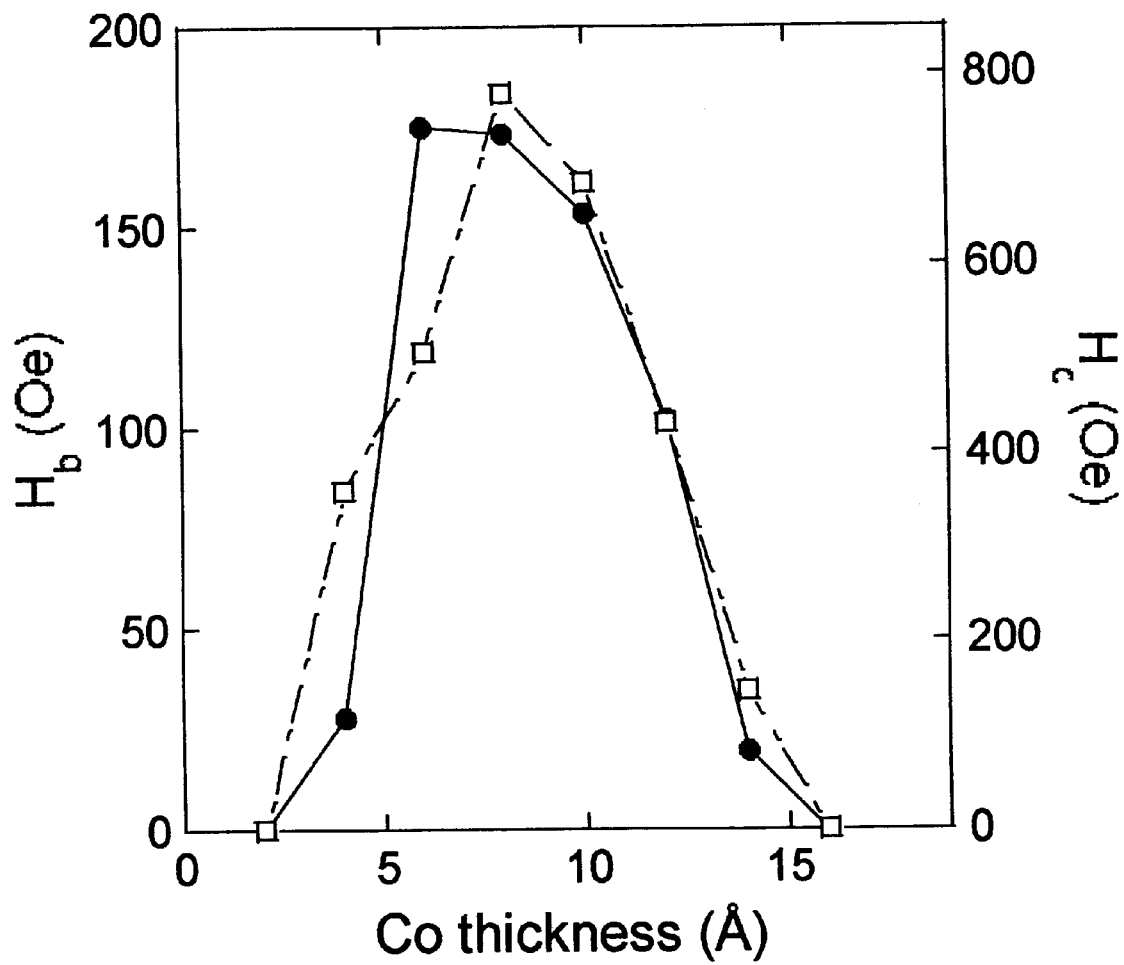
FIG. 6: Perpendicular exchange bias field (filled circles) and coercivity (open squares) of a family of Si/SiO$_2$/150 Å PT/500 Å NiO/[x Å Co/7 Å Pt]$_N$ multilayers as a function of thickness of the Co layer for N=1.

FIG. 6 shows the perpendicular exchange bias field (filled circles) and coercivity (open squares) of a family of Si/$SiO_2$/150 Å Pt/500 Å NiO/[x Å Co/7 Å Pt]$_N$ multilayers as a function of the thickness of the Co layer for N=1. The multilayer no longer exhibits a perpendicular easy axis of magnetization for Co layers thicker than ~11 Å. These results clearly establish perpendicular exchange bias at room temperature.

Figure 7:
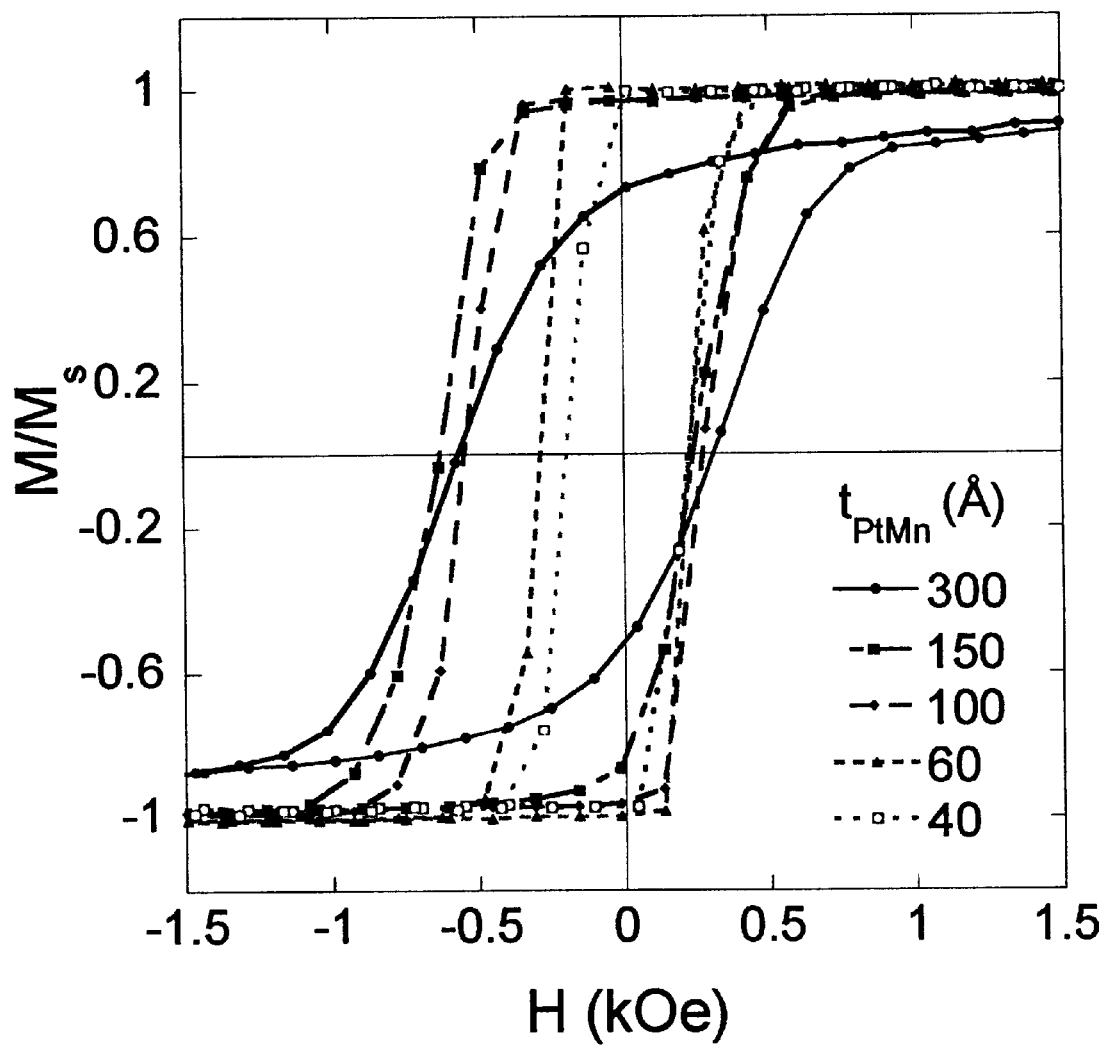
FIG. 7: Normalized perpendicular magnetization versus perpendicular magnetic field for a series of samples with structure Si/SiO2/50 Å Ta/150 Å Pt/PtMn ($t_{PtMn}$)/[7 Å Co/5 Å Pt]$_3$/20 Å Pt for $t_{PtMn}$ varying from 40 to 300 Å.
Figure 8:
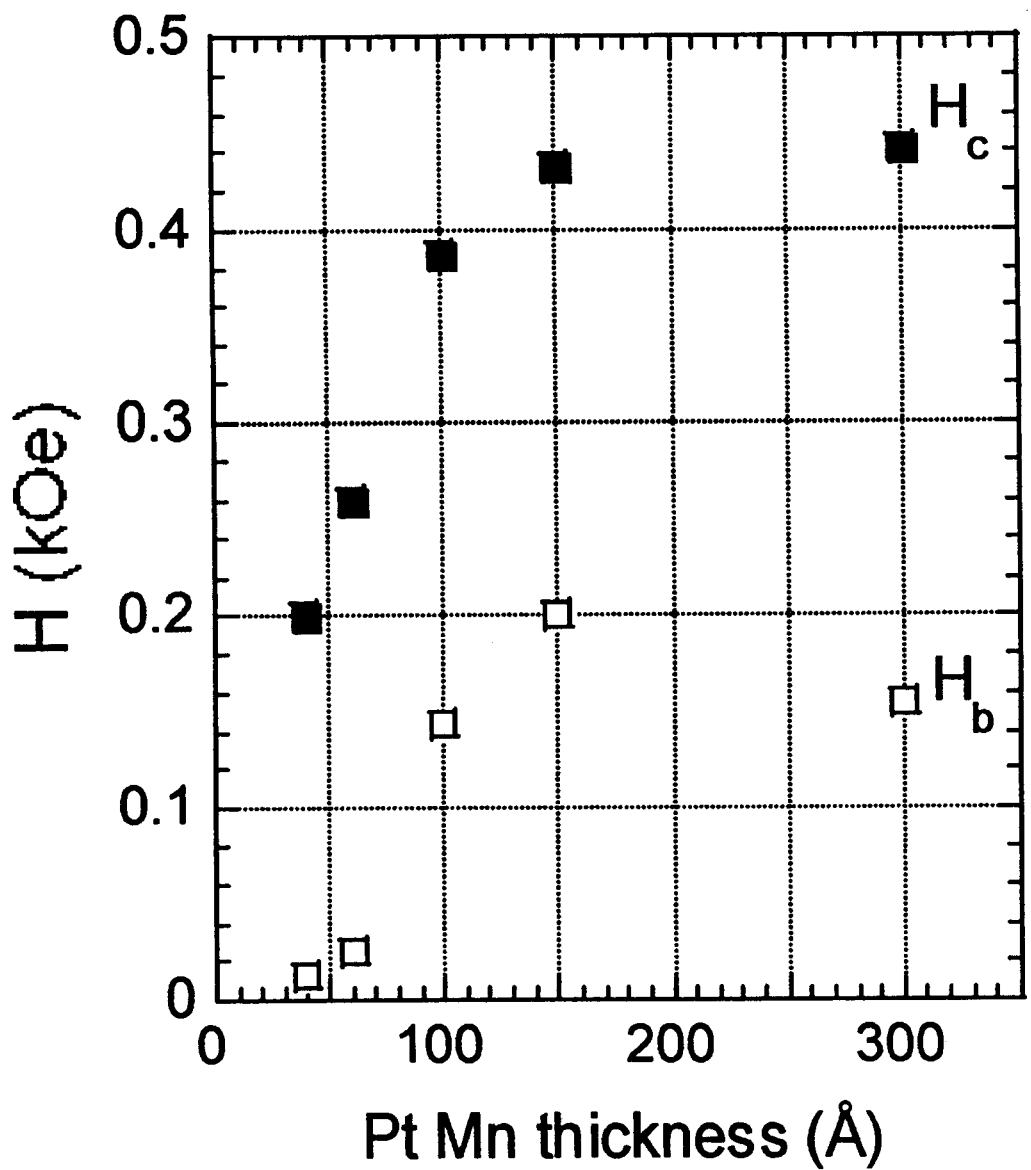
FIG. 8: Perpendicular exchange bias field $H_B$ and coercive field $H_C$ as a function of PtMn thickness for a series of films with the structure Si/SiO2/50 Å Ta/150 Å Pt/PtMn ($t_{PtMn}$)/[7 Å Co/5 Å Pt]$_3$/20 Å Pt.

CoO, NiO and $Co_{1-x}Ni_xO$ are insulating antiferromagnetic layers. However, perpendicular exchange bias is not solely a property of insulating antiferromagnetic layers. FIG. 7 shows the structure of a perpendicular exchange biased system with PtMn as the antiferromagnetic layer. These structures were deposited by dc magnetron sputtering in 3 mTorr argon at ambient temperature on Si(100) wafers covered with ~5000 Å $SiO_2$. First 50 Å Ta/150 Å Pt underlayers were deposited to provide a suitable template layer for the PtMn layer. The PtMn films had a composition of ~$Pt_{48}Mn_{52}$ as determined by RBS measurements on companion films. $[Co/Pt]_N$ multilayers were grown on top of the PtMn layers with varying Co and Pt thicknesses and varying number of Co/Pt bilayers. Magnetic hysteresis loops are shown in FIG. 7 for a set of films with [7 Å Co/5 Å Pt]$_3$ ferromagnetic layers and PtMn layers with thickness $t_{PtMn}$ which was varied from 40 to 300 Å. FIG. 7 shows that significant exchange bias fields are observed at room temperature. No exchange bias field was found in the as-deposited films. In order to obtain longitudinal exchange bias with PtMn antiferromagnetic layers the $Pt_{1-x}Mn_x$ alloy has to have a composition in the range x~0.45–0.49 and the PtMn alloy has to be chemically ordered. The chemical ordering is accomplished by annealing the structure at an elevated temperature for a suitable length of time. The structures here were annealed at 280° C. for 60 minutes in a perpendicular field of ~1000 Oe and were subsequently cooled to ambient temperature in the same field. The perpendicular exchange bias fields and coercive fields for these structures are shown in FIG. 8 as a function of PtMn thickness. Exchange bias fields of up to ~200 Oe are observed at room temperature.

Figure 9:
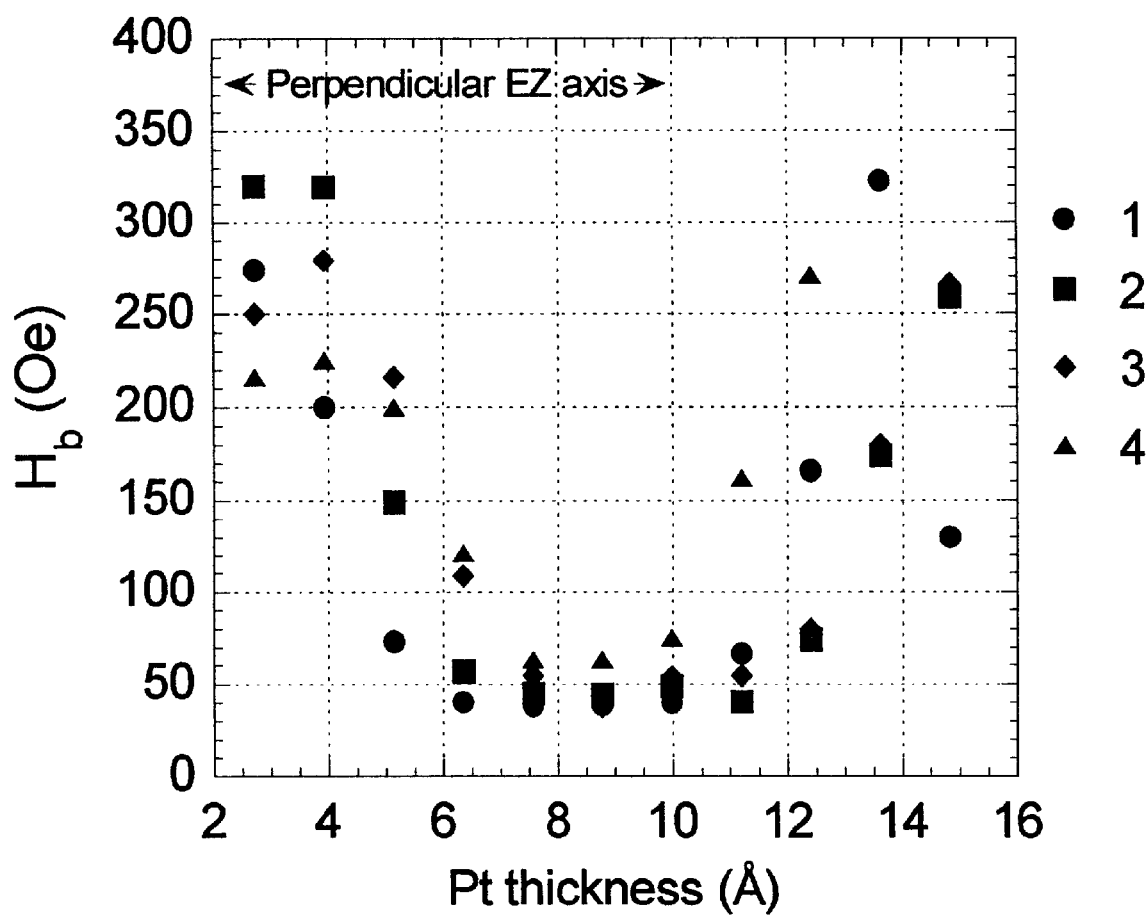
FIG. 9: Dependence of exchange bias field on Pt thickness for a series of structures of the form Si/SiO2/50 Å Ta/150 Å Pt/300 Å PtMn/[7 Å Co/$t_{Pt}$ Å Pt]$_N$/20 Å Pt for N=1 to 4 bilayers and for Pt thickness $t_{Pt}$ varying from 2 to 16 Å.

The strength of the perpendicular exchange bias field depends on the thickness of the Co and Pt layers and the number of Co/Pt bilayers. FIG. 9 shows the dependence of exchange bias field on the thickness of Pt for a series of structures of the form Si/$SiO_2$/50 Å Ta/150 Å Pt/300 Å PtMn/[7 Å Co/$t_{Pt}$ Å Pt]$_N$/20 Å Pt for N=1 to 4 bilayers and for Pt thickness $t_{Pt}$ varying from 2 to 16 Å. The Co/Pt multilayer has a perpendicular easy axis for $t_{Pt}$<~10 Å. For thicker Pt layers the easy anisotropy axis is in the plane of the film. For thinner Pt layers the exchange bias field $H_B$ is increased to more than 300 For N=1 for thin Pt the coercive field is quite small in the range of 50–100 Oe depending on the Pt thickness. We conclude that substantial perpendicular exchange bias fields can be readily obtained using PtMn antiferromagnetic layers.

First Embodiment of Invention: Perpendicular Magnetic Media

The areal density, i.e., the number of magnetic bits per unit area of magnetic media, in magnetic disk drives has significantly increased in recent years and is continuing to increase very rapidly. Whereas today the vast majority of magnetic recording disk drives use longitudinally magnetized magnetic media, perpendicularly magnetized magnetic media may have technological advantages for ultra-high density magnetic recording for areal densities above ~100 Gbit/$in^2$. Useful magnetic thin film materials for perpendicular recording include CoCrPt and FePt alloys and Co/Pd, Co/Pt and Fe/Pt multilayers. For improved recording performance, the above alloys and multilayers are often doped with additional elements. For example, CoCrPtX alloys are commonly used for longitudinal recording, where X=B, Nb, and Ta as the typical dopants. Such structures are also proposed for perpendicular recording. Similarly, the Co layers in Co/Pd and Co/Pt multilayers are often replaced by Co—Y alloys where Y=B, Ta, Cr, O, Cu, Ag, Pt, Pd. In the following we will refer to CoCrPt and FePt alloys and Co/Pd and Co/Pt multilayers but the results and discussion apply equally to CoCrPtX and FePtX alloys and CoY/Pd and CoY/Pt alloys.

As the size of the magnetic bits shrink the magnetic bits become more susceptible to demagnetization from thermal fluctuations, the so-called superparamagnetic effect. The magnetic anisotropy of the magnetic material may be increased to stabilize the magnetic bits from the superparamagnetic effect but the magnetic anisotropy of suitable magnetic materials is limited. Moreover, it may be difficult to find suitable magnetic materials with the required combination of properties including flatness, thickness, magnetic moment per unit area and magnetic anisotropy. Alternative methods to increase the magnetic stability of magnetic media against thermal fluctuations are needed. It has been demonstrated for longitudinally magnetized magnetic media that one method to increase the coercivity and stability of the ferromagnetic layer without increasing its magnetic moment is by exchange coupling the ferromagnet to an antiferromagnet using the well known in-plane exchange bias effect.

Figure 1C:
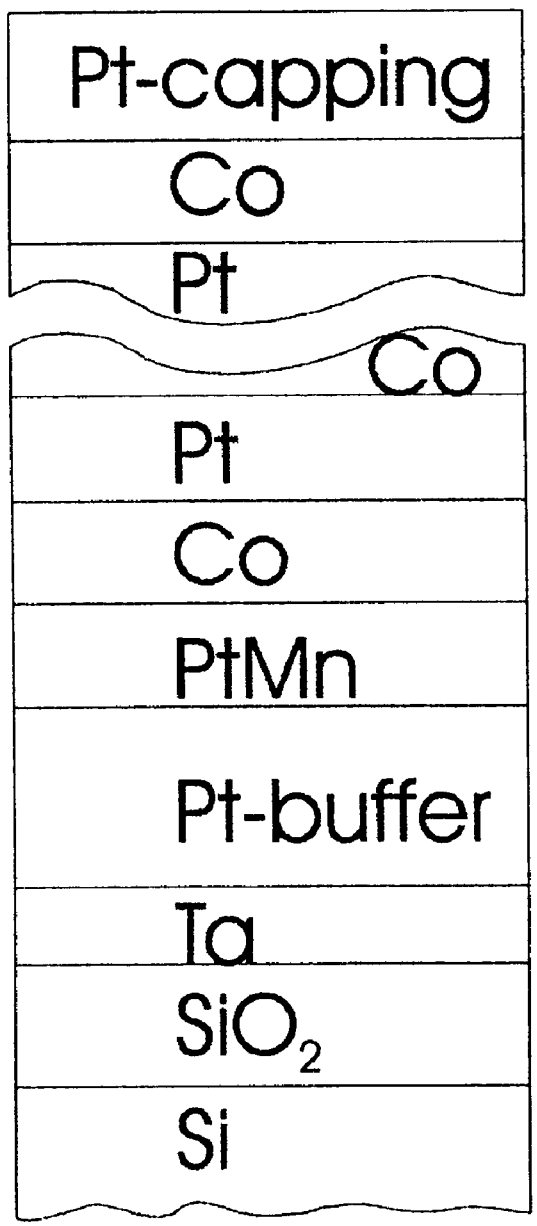
FIG. 1C: PtMn antiferromagnetic layer exchange biased with Co/Pt multilayer with perpendicular anisotropy.
Figure 10A:
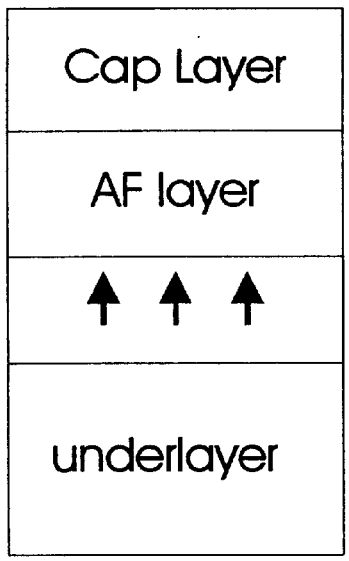
FIGS. 10A, 10B and 10C: Sectional schematic views of structures for perpendicular magnetic recording media.
Figure 10B:
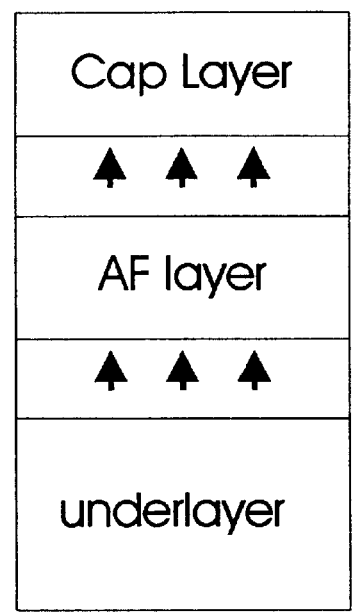
Figure 10C:
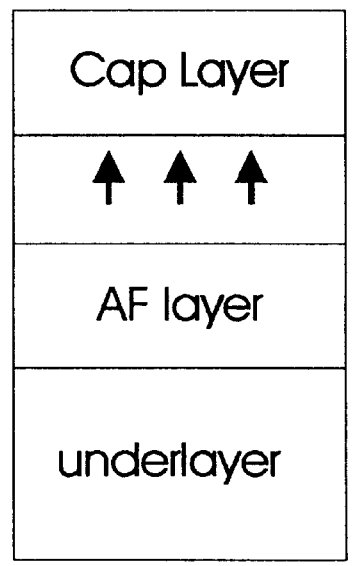

The magnetic stability of the magnetic media in a perpendicular magnetic recording device can be enhanced by contact with an AF layer that is exchange coupled to the media. FIGS. 10A–10C illustrate improved magnetic media according to this invention. The enhanced magnetic stability can be achieved by locating an AF layer 310 at the top of the ferromagnetic layer 305, as shown in FIG. 10A and as demonstrated in FIG. 1A, or by locating the AF layer 310' at the bottom of the ferromagnetic layer 305', as shown in FIG. 10C and demonstrated in FIGS. 1B and 1C. The AF can also be located within the ferromagnetic media layer (306 and 308) itself, as shown in FIG. 10B. Combining the different structures shown in FIGS. 10A–10C is also possible. The choice of the AF layer material and its location within the structure will depend on the ferromagnetic layer material.

As described above exchange coupling of a F layer to an AF layer leads to both an increase of the coercivity of the F layer as well as an offset of the magnetic hysteresis loop of the F layer. For magnetic media applications it is advantageous to have a coercivity enhancement without any loop shift. This is commonly observed for many F/AF coupled magnetic system when the layer thickness of the AF layer is below a critical thickness. This phenomenon, coercivity enhancement without a loop shift, is also observed for systems that show a high amount of interfacial F/AF spin-frustration. This condition occurs at spin-compensated AF surfaces, i.e., AF surfaces that exhibit no net moment. To minimize energy the F spins may undergo a spin-flop transition with respect to the AF spins. The resulting increased coercivity of the F layer has been calculated recently by T. C. Schulthess and W. H. Butler, J. Appl. Phys. 85, 5510 (1999) using a micromagnetic model. An experimental example for longitudinal biasing without loop-shift are FeRh$_{0.95}$Ir$_{0.5}$/NiFe bilayers studied by S. Yuasa, M. Nyvlt, T. Katayama, and Y. Suzuki, J. Appl. Phys. 83, 6813 (1998). Typical ferromagnetic layers, 305, 305', 306 and 308, in which data is recorded for both longitudinal and perpendicular magnetic recording, are alloys of Co—Pt—Cr. These films must be deposited on suitable underlayers to promote their proper crystallographic structure and orientation. For perpendicular recording the Co—Pt—Cr layer must have the c(easy magnetic axis) of its hcp structure oriented normal to the Co—Pt—Cr film plane. In the media shown in FIG. 10A this is achieved by the proper choice of the underlayer 301 structure and orientation. Common examples are (0002) oriented layers of hcp materials (for example, Ti or non-magnetic Co—Cr alloys) or (111) oriented layers of fcc materials such as Pt. The media is covered with an overcoat or capping layer 320 (or 320' or 320" in FIGS. 10C and 10B, respectively) that protects the media from wear and oxidation. Thus, if the AF layer is located below or within the media (AF layers 310' and 310" in FIGS. 10C and 10B, respectively), the AF layer must itself have suitable structural characteristics to promote the proper growth of the media layer in the required crystallographic orientation. For Co—Pt—Cr alloy media layers, the underlayers must have the correct crystallographic symmetry to promote c-axis, small-grain growth. This can be achieved by the (111) growth orientation of fcc underlayers or by the c-axis growth of hcp underlayers. For Fe—Pt alloy recording layers, the required symmetry of the AF layer would be (001) orientation of cubic AF materials to promote the growth the FePt perpendicular to the film. Multilayer media, such as Co/Pd or Co/Pt multilayers, do not in general require a preferred crystallographic axis and therefore can be grown on any crystallographic orientation of the AF layer and maintain the perpendicular anisotropy.

When the AF layer is grown on top of the media layer (layer 310 in FIG. 10A) the orientation of the AF layer will not effect the growth of the media layer and thus the AF layer can be chosen to optimize the exchange interaction between the ferromagnetic and AF layers. However, a disadvantage of this structure is an increased spacing between the media and recording head leading to increased spacing loss.

Second Embodiment of Invention: Improved Longitudinally Biased Magnetic Tunnel Junction Read Head MTJ devices have been proposed as memory cells for solid-state memory and for use in magnetoresistive (MR) sensors, especially for magnetic recording read heads. A magnetic tunnel junction (MTJ) device is comprised of two ferromagnetic layers separated by a thin insulating tunnel barrier layer and is based on the phenomenon of spin electron tunneling. One of the ferromagnetic layers has a higher saturation field in one direction of an applied magnetic field, typically due to its higher coercivity than the other ferromagnetic layer. The insulating tunnel barrier layer is thin enough that quantum mechanical tunneling occurs between the ferromagnetic layers. The tunneling phenomenon is electron dependent, making the magnetic response of the MTJ a function of the relative orientations and spin polarizations of the two ferromagnetic layers. Usually the tunneling probability of the charge carriers is highest when the magnetic moments of the ferromagnetic layers are parallel to one another. Thus, the resistance of the MTJ device is lowest when the magnetic moments of both layers are parallel, and is highest when the magnetic moments are antiparallel. When the moments are arranged neither parallel nor antiparallel, the tunneling probability and the resistance take an intermediate value.

One of the problems with an MR read head lies in developing a structure that generates an output signal that is both stable and linear with the magnetic field strength from the recorded medium. If some means is not used to maintain the ferromagnetic sensing layer of the MTJ device (i.e., the ferromagnetic layer whose moment is not fixed) in a single magnetic domain state, the domain walls of magnetic domains will shift positions within the ferromagnetic sensing layer, causing noise which reduces the signal to noise ratio and which may give rise to an irreproducible response of the head. A linear response of the head is required. The problem of maintaining a single magnetic domain state is especially difficult in the case of an MTJ MR read head because the sense current passes perpendicularly through the ferromagnetic layers and the tunnel barrier layer, and thus any metallic materials in direct contact with the edges of the ferromagnetic layers will short circuit the electrical resistance of the read head.

One solution is described in IBM's U.S. Pat. No. 5,729,410 as shown in FIG. 11. This patent describes an MTJ device with one fixed ferromagnetic layer 118 and one sensing ferromagnetic layer 132 on opposite sides of the tunnel barrier layer 120. The moments of the fixed and sensing ferromagnetic layers are oriented longitudinally in the plane of these layers. There is also a hard-biasing ferromagnetic layer 150 that is electrically insulated from but yet magnetostaticly coupled (as illustrated by the arrows 153) with the sensing ferromagnetic layer 132. The magnetic tunnel junction in the MTJ device is formed on an electrical lead 102 on a substrate and is made up of a stack of layers. The layers in the stack are an underlayer 112, which may be formed from several layers, an antiferromagnetic layer 116, a fixed ferromagnetic layer 118 exchange biased with the antiferromagnetic layer so that its magnetic moment 119 cannot rotate in the presence of an applied magnetic field, an insulating tunnel barrier layer 120 in contact with the fixed ferromagnetic layer 118, and a sensing ferromagnetic layer 132 in contact with the tunnel barrier layer 120 and whose magnetic moment 133 is free to rotate in the presence of an applied magnetic field. The stack is generally rectangularly shaped with parallel side edges so that the layers have contiguous edges. A layer of hard biasing ferromagnetic material 150 is located near to but spaced from the side edges of the sensing ferromagnetic layer to longitudinally bias the magnetic moment of the sensing ferromagnetic layer in a preferred direction within the plane of this layer in the absence of an applied magnetic field. A layer of electrically insulating material 220 isolates the hard biasing material from the electrical lead and the sensing ferromagnetic layer so that sense current is not shunted to the hard biasing material but is allowed to flow perpendicularly through the layers in the magnetic tunnel junction stack.

In the prior art MTJ MR sensor shown in FIG. 11 since the biasing layer is formed from a metallic ferromagnetic material the biasing layer 150 must be isolated from the MTJ sensor by an insulating layer 220. The insulating layer 220 must have a thickness sufficient to electrically isolate the biasing layer 150 from the MTJ and the electrical leads but must be thin enough to permit magnetostatic coupling (shown by dashed arrow) with the sensing ferromagnetic layer 132. This makes the fabrication of the MTJ MR sensor more complicated than would be possible if the longitudinal bias layer 150 could be in direct contact with the MTJ stack.

Figure 12:
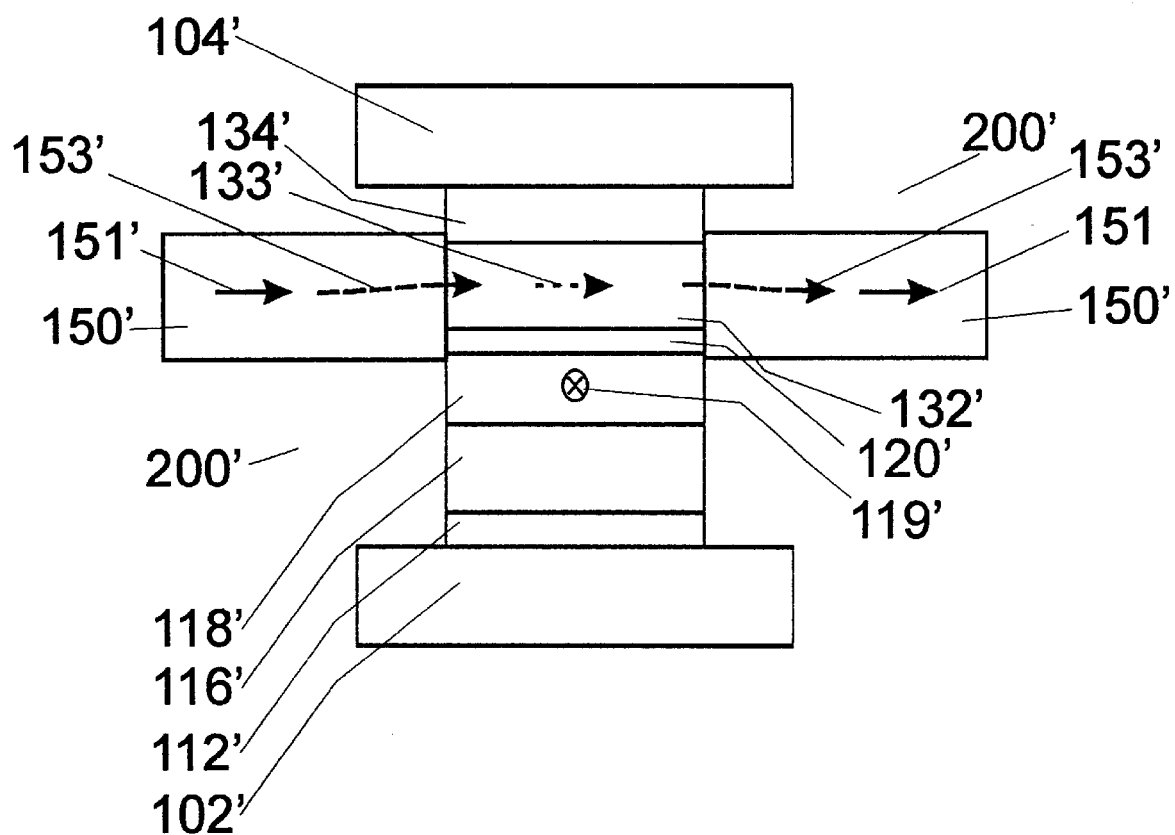
FIG. 12: A schematic sectional view of an MTJ MR read head according to the present invention illustrating the arrangement of the various layers of material, including the AF/F bilayer structure for providing longitudinal biasing of the sensing ferromagnetic layer without the need for an insulating layer between the longitudinal bias layer and the sensing ferromagnetic layer.

In the present invention, as shown in FIG. 12, the longitudinal bias layer 150' can be in direct contact with the MTJ stack because it is formed from an insulating material. In particular, by taking advantage of perpendicular exchange bias, the layer 150' is formed from a layer of insulating NiO which is in direct contact with the edges of the MTJ sensor. Preferably the NiO layer is only in contact with the edges of the sensing ferromagnetic layer 132', but because the moment of the ferromagnetic layer 118' is fixed by exchange bias with the conducting antiferromagnetic bias layer 116', the layer 150' can also be in contact with edges of the fixed ferromagnetic layer 118'. The layer 150' can also be in contact with the edges of the antiferromagnetic bias layer 116'. Most importantly because the layer 150' is formed from an insulating antiferromagnetic material the layer 150' can be in contact with both the free and fixed ferromagnetic layers without electrically shorting these layers. Note that even though the magnetic moment of the ferromagnetic layer 132' is in the plane of the layer, its magnetic moment along the sides of the layer will point perpendicularly to these edge surfaces as indicated by the arrow 133'. Thus the antiferromagnetic oxide layer 150' can provide a perpendicular exchange biasing field to longitudinally stabilize the in-plane magnetic moment of the free layer 132'.

The perpendicular biasing antiferromagnetic layer can be formed from any insulating antiferromagnetic material which exhibits the perpendicular exchange bias effect. For example this layer can be formed from an oxide of Ni—Co for which the blocking temperature is intermediate between that of CoO and NiO. Similarly, this layer could be formed from an insulating antiferromagnetic iron oxide, for example, $\alpha$-$Fe_2O_3$. The direction of the perpendicular exchange bias field, shown by the arrow 151', must be set so that it is along the same direction as the magnetic moment of the sensing ferromagnetic layer in the absence of an applied magnetic field. Since the moment of the fixed ferromagnetic layer 118' is fixed by the longitudinal exchange bias layer 116' it is important that the blocking temperature of the layer 116' is much higher than that of the perpendicular exchange bias layer 150'. Thus the direction of the longitudinal exchange bias field provided by the layer 116' is first set by heating the MTJ device above the blocking temperature of layer 116' and cooling the sensor in an applied field large enough to orient the moment of layer 118' in the direction 119'. The direction of the longitudinal bias field from layer 116' will then be set along the direction 119'. In a second step the direction of the perpendicular exchange bias field provided by the regions 150' is set by heating the MTJ sensor above the blocking temperature of the perpendicular exchange bias layer 150' but well below the blocking temperature of the longitudinal exchange bias layer 116'. The MTJ sensor is then cooled in a magnetic field large enough to align the moment of the sense layer along the direction 153'. Suitable materials for the longitudinal exchange bias layer 116' include Pt—Mn and Ni—Mn alloys which have sufficiently high blocking temperatures compared to the blocking temperature of NiO which forms the perpendicular exchange bias layer 150'. The layer 116' could also be formed from an Ir—Mn alloy layer.

Figure 13:
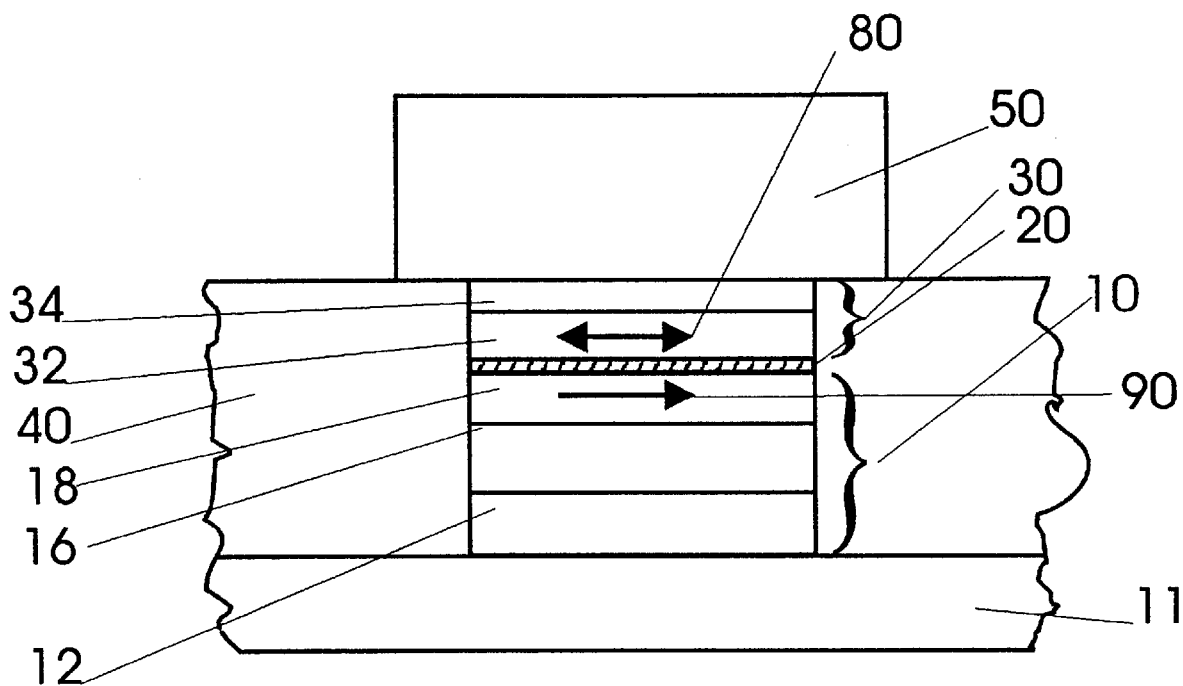
FIG. 13: A prior art MTJ memory cell showing the AF/F bilayer structure for biasing the moment of the pinned ferromagnetic layer in the plane of the layer.

Third Embodiment of Invention: Magnetic Tunnel Junction Memory Storage Cell with Perpendicularly Exchange Biased Pinned Ferromagnetic Layer and Perpendicularly Magnetized Free Layer Magnetic tunnel junction structures can be used as non-volatile memory storage cells as described in IBM's U.S. Pat. No. 5,650,958. The MTJ memory storage cell in the prior art is comprised of two ferromagnetic layers each with their moments in the plane of these layers. A prior art MTJ storage cell is shown in FIG. 13. The cell is comprised of metallic lower and upper wires 11 and 50 to provide electrical current to the MTJ cell for reading the state of the cell. The MTJ cell is further comprised of lower 10 and upper 30 ferromagnetic electrodes which are separated by a thin insulating tunneling barrier 20. The barrier is a layer of $Al_2O_3$ which is formed by first depositing a thin layer of Al metal and then oxidizing it. The lower MTJ electrode includes an underlayer 12 which is used to promote the growth of the antiferromagnetic layer 16, which is used to exchange bias the ferromagnetic layer 18. Layers 16 and 18 form a AF/F exchange biased bilayer structure that enables the moment of the F layer 18 to be fixed along a particular direction in the plane of the film 18 by means of exchange biasing with the AF layer 16. The arrow 90 indicates the direction. The direction of the exchange bias field is fixed by cooling the device from a temperature above the blocking temperature of the AF and cooling the device through the blocking temperature to at least the operating temperature of the device in a magnetic field large enough to saturate the magnetic moment of the F layer in the direction of the magnetic field. The upper ferromagnetic electrode 30 is a ferromagnetic layer 32 and an overlayer 34. The direction of the moment of the F layer 32 is indicated by the arrow 80 and is in the plane of the layer 32 but can be either parallel or antiparallel to that of the moment of the pinned F layer 90. The memory cell has two magnetic states in which the moments of the pinned layer 18 and that of the free F layer 32 are either parallel or antiparallel and in the plane of the MTJ device.

As the size of the MTJ device is shrunk laterally, which is required for scaling to ever greater memory capacities, the total moments of each of the F layers becomes smaller and smaller if the thickness of these layers is maintained approximately constant. Thus, for small enough MTJ devices, the magnetic anisotropy of these layers is not sufficient to maintain the magnetic moments in the required orientation because of the well-known superparamagnetic effect whereby thermal fluctuations will cause the magnetic moments to fluctuate. One way to avoid this problem is to increase the thickness of the F layers but, for sufficiently narrow MTJ devices, this means that the moments of the F layers will prefer to align themselves perpendicular to the plane of the layers. What is needed is a means of pinning the magnetic moment of the fixed F layer perpendicular to the plane of this layer.

Figure 14:
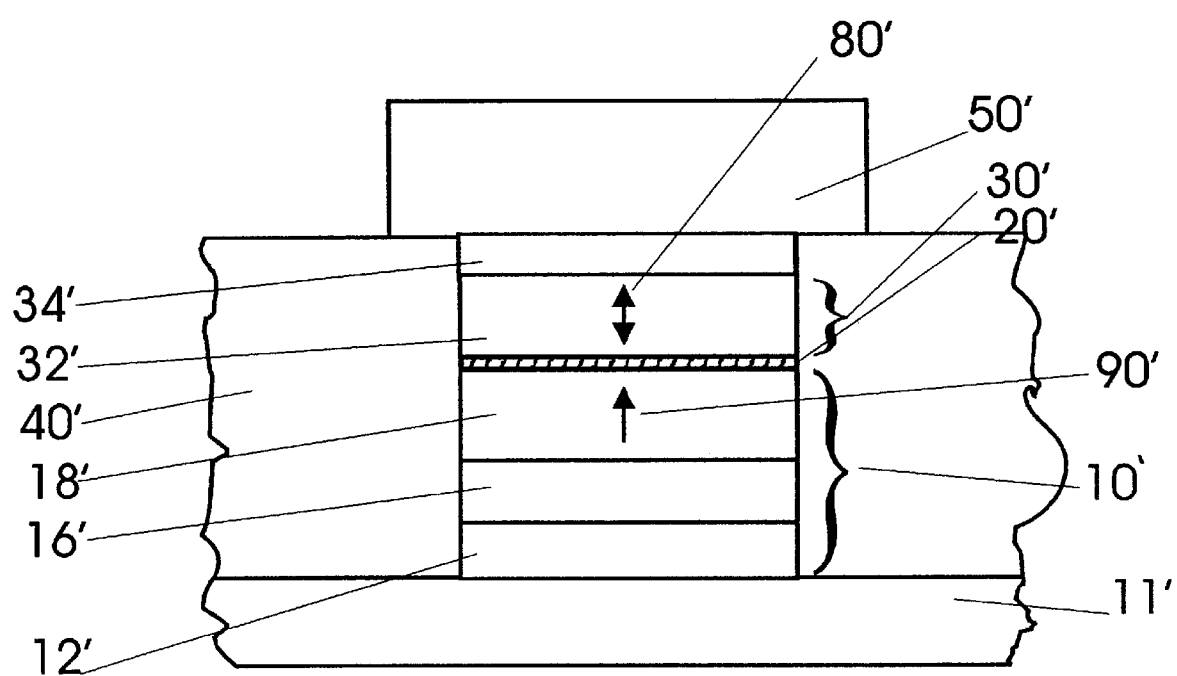
FIG. 14: An MTJ memory cell according to the present invention showing the AF/F bilayer structure for biasing the moment of the pinned ferromagnetic layer perpendicular to the plane of the layer.

FIG. 14 shows a MTJ memory cell according to the present invention in which the magnetic moments of the fixed ferromagnetic layer 18' and the free ferromagnetic layer 32' are oriented perpendicular to the plane of the layers, as shown by the arrows 90' and 80' respectively. The moment of the fixed ferromagnetic layer is pinned by exchange biasing to an AF layer 16' which displays perpendicular exchange bias. Since current must be passed perpendicularly through the ferromagnetic layers of the MTJ device for reading the state of the cell, the AF layer 16' must be conducting. Thus a suitable AF material is the PtMn alloy as described above and shown in FIG. 1C.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic device comprising:

a substrate;

an underlayer on the substrate;

a bilayer of a first ferromagnetic layer and an antiferromagnetic layer on the underlayer, the first ferromagnetic layer having perpendicular magnetic anisotropy with its magnetic moment oriented generally perpendicular to a plane defined by the interface between the first ferromagnetic layer and the antiferromagnetic layer and being in contact with and perpendicularly biased by the antiferromagnetic layer; and a capping layer over the bilayer, wherein the device is a magnetic tunnel junction memory cell having a pinned ferromagnetic layer, a free ferromagnetic layer and an insulating tunnel barrier layer between the pinned and free layers, wherein the material of the antiferromagnetic layer is a platinum-manganese (PtMn) alloy directly on and in contact with the underlayer, and wherein the first ferromagnetic layer is the pinned layer with its magnetic moment pinned in a direction perpendicular to the tunnel barrier layer by being perpendicularly exchange biased by the PtMn alloy antiferromagnetic layer.

* * * * *